(12) United States Patent
Grivna (10) Patent No.: US 7,123,173 B1
(45) Date of Patent: Oct. 17, 2006

(54) METHOD AND SYSTEM FOR A FEED-FORWARD ENCODER

(75) Inventor: Edward Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/822,183

(22) Filed: Apr. 8, 2004

(51) Int. Cl.
 *H03M 7/30* (2006.01)
(52) U.S. Cl. .............................. 341/58; 341/59; 341/68
(58) Field of Classification Search .................. 341/58, 341/59
 See application file for complete search history.

(56) References Cited

U.S. PATENT DOCUMENTS

| | | | |
|---|---|---|---|
| 4,486,739 A | 12/1984 | Franaszek et al. | |
| 5,177,482 A | * 1/1993 | Cideciyan et al. | 341/59 |
| 5,825,309 A | * 10/1998 | Matsui et al. | 341/58 |

OTHER PUBLICATIONS

Millman, Microelectronics-Digital and Analog Circuits and Systems, copyright 1972 McGraw-Hill, Inc., p. 199.*

Cideciyan, R.D; Attractive Line Codes for High-Speed LANs and MANs and Their Realization;1993 International Conference on Communications, ICC 93, Geneva. Technical Program, Conference Record, IEEE Publication Date: May 23-26, 1993, vol. 3 pp. 1836-1842 Meeting Date: May 23, 1993-May 26, 1993 Location: Geneva INSPEC Accession No. 4972647.*

A.S. Widmer et al.; "A DC-Balanced Partitioned-Block, 8B/10B Transmission Code"; IBM Journal of research and delelopment, vol. 27, No. 5, Sep. 1983.

Paul et al.; "Faster 8b/10b Encoding And Decoding On Multi-Byte Datapath"; provisional application filed on Sep. 17, 2003 with U.S. Appl. No. 60/503,570.

* cited by examiner

*Primary Examiner*—Howard L. Williams
(74) *Attorney, Agent, or Firm*—Blakely Sokoloff Taylor & Zafman LLP (57) ABSTRACT

A method and system for a feed-forward encoder is described. The method includes evaluating one or more source characters to determine whether each source character will invert or maintain a current running disparity and determining a running disparity for each source character before encoding the source character based on the current running disparity and whether the source character will invert or maintain the current running disparity. The current running disparity along with the associated source character may then be passed to an encoder to encode the source character into a transmission character.

18 Claims, 8 Drawing Sheets

Table of 8B/10B Characters
400

| 5B/3B | 0 | 1 | 2 | 3 | 4 | 5 | 6 | 7 |
|---|---|---|---|---|---|---|---|---|
| 00 | X |   |   |   | X |   |   | X |
| 01 | X |   |   |   | X |   |   | X |
| 02 | X |   |   |   | X |   |   | X |
| 03 |   | X | X | X |   | X | X |   |
| 04 | X |   |   |   | X |   |   | X |
| 05 |   | X | X | X |   | X | X |   |
| 06 |   | X | X | X |   | X | X |   |
| 07 |   | X | X | X |   | X | X |   |
| 08 | X |   |   |   | X |   |   | X |
| 09 |   | X | X | X |   | X | X |   |
| 0A |   | X | X | X |   | X | X |   |
| 0B |   | X | X | X |   | X | X |   |
| 0C |   | X | X | X |   | X | X |   |
| 0D |   | X | X | X |   | X | X |   |
| 0E |   | X | X | X |   | X | X |   |
| 0F | X |   |   |   | X |   |   | X |
| 10 | X |   |   |   | X |   |   | X |
| 11 |   | X | X | X |   | X | X |   |
| 12 |   | X | X | X |   | X | X |   |
| 13 |   | X | X | X |   | X | X |   |
| 14 |   | X | X | X |   | X | X |   |
| 15 |   | X | X | X |   | X | X |   |
| 16 |   | X | X | X |   | X | X |   |
| 17 | X |   |   |   | X |   |   | X |
| 18 | X |   |   |   | X |   |   | X |
| 19 |   | X | X | X |   | X | X |   |
| 1A |   | X | X | X |   | X | X |   |
| 1B | X |   |   |   | X |   |   | X |
| 1C |   | X | X | X |   | X | X |   |
| 1D | X |   |   |   | X |   |   | X |
| 1E | X |   |   |   | X |   |   | X |
| 1F | X |   |   |   | X |   |   | X |

METHOD AND SYSTEM FOR A FEED-FORWARD ENCODER

BACKGROUND

1. Technical Field

Embodiments of the invention relate to the field of circuits for data communications encoding, and more specifically to a feed-forward encoder.

2. Background Information and Description of Related Art

Figure 1:
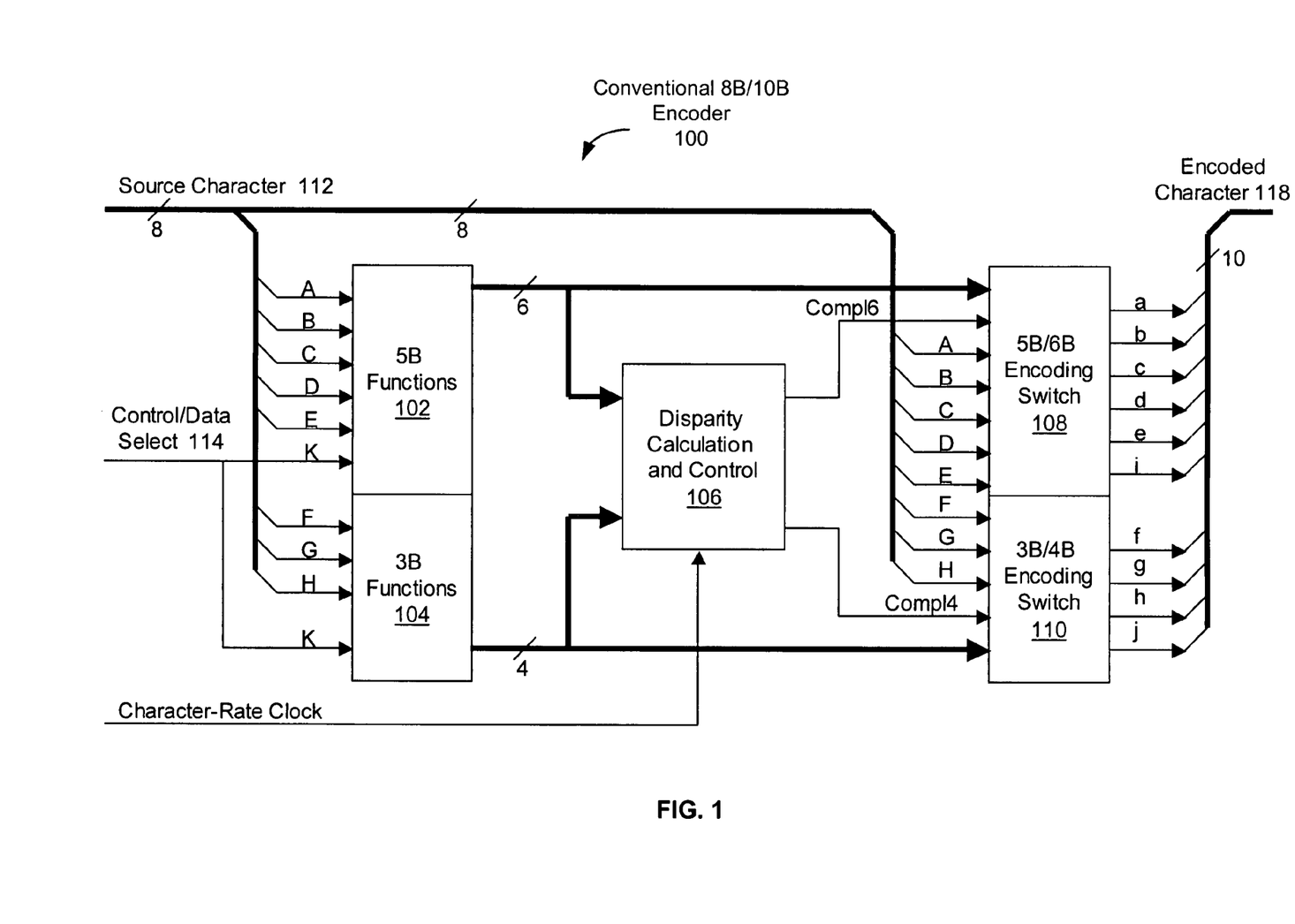
FIG. 1 is a block diagram illustrating a conventional 8B/10B encoder.

A conventional 8B/10B encoder used for encoding signals for data communications is shown in FIG. 1. This encoder is described in U.S. Pat. No. 4,486,739 and in an article entitled "A DC-Balanced Partitioned-Block, 8B/10B Transmission Code," IBM Journal of Research and Development, Volume 27, Number 5, September 1983, pages 440–451.

The encoder of FIG. 1 maps each incoming source 8-bit character 112 into a 10-bit encoded transmission character 118 based on the contents of the source character 112, a data/control selector bit 114, and a current running disparity. The running disparity of the character being encoded is calculated based on the resulting transmission character and is fed back to be used to encode the next character. The first five bits of each source character are fed into combinatorial logic block 102 that produces partial encodings based on the values of those bits. The last three bits are likewise fed into a similar block 104. These partial encodings are used, in conjunction with the current running disparity from the previous character, to determine how the final encoding should occur to maintain DC balancing of the resulting transmission character stream. This is done by block 106, which uses the partial encodings determined by blocks 102 and 104 and the current running disparity of the previous transmission character. The final encoding is done in combinatorial logic blocks 108 and 110.

Figure 2:
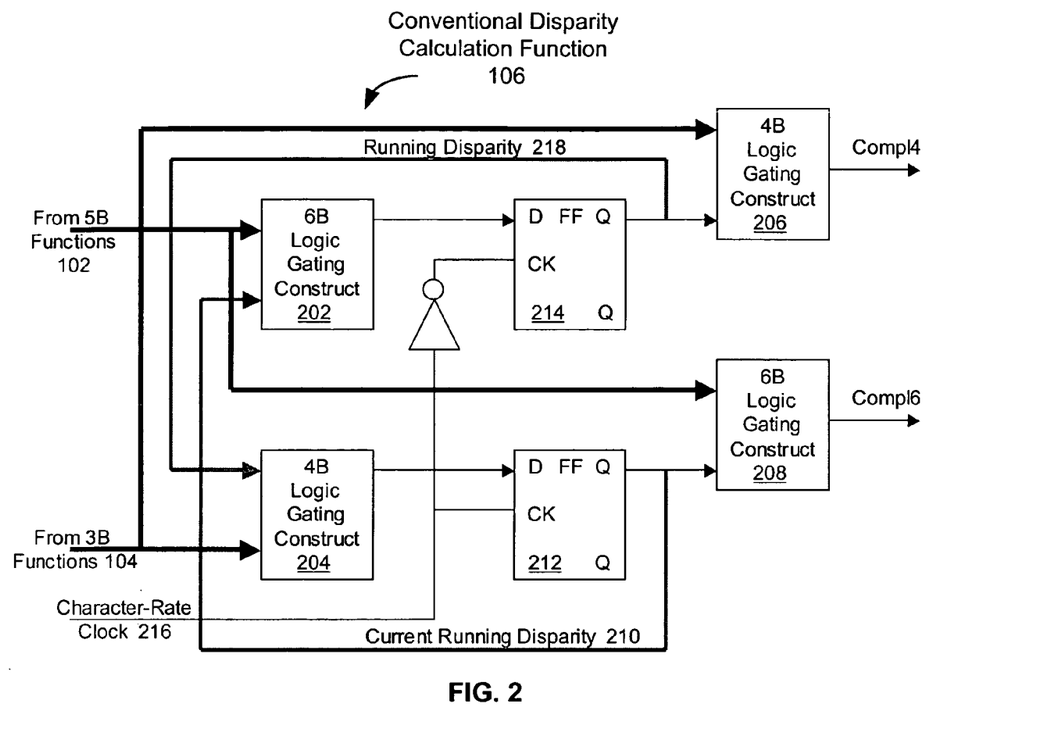
FIG. 2 is a block diagram illustrating a conventional running disparity calculation function.

A conventional running disparity calculation function 106 is shown in FIG. 2. As shown, the six bits from the 5B functions block 102 and the current running disparity 210 of the previous transmission character are input into combinatorial logic block 202. Combinatorial logic block 202 resolves these seven bits to a single bit, which is then captured in flip-flop 214 on the falling edge of the clock 216. The output of flip-flop 214 tracks the running disparity of the first six bits of the transmission character, and is passed to logic blocks 204 and 206. The output of block 206 is used to control the final encoding of the last four bits of that transmission character. The four bits from the 3B functions block 104 and the running disparity 218 of the first six bits are input into combinatorial logic block 204. Combinatorial logic block 204 resolves these five bits to a single bit, which is then captured in flip-flop 212 on the rising edge of the clock. The output of flip-flop 212 is the running disparity of the entire transmission character, and is passed to logic block 208. The output of block 208 is used to control the final encoding of the first six bits of that transmission character. As shown by the cross-coupling in FIG. 2, it is necessary for one portion of the character to complete evaluation before the next section can begin the encoding process.

Figure 3A:
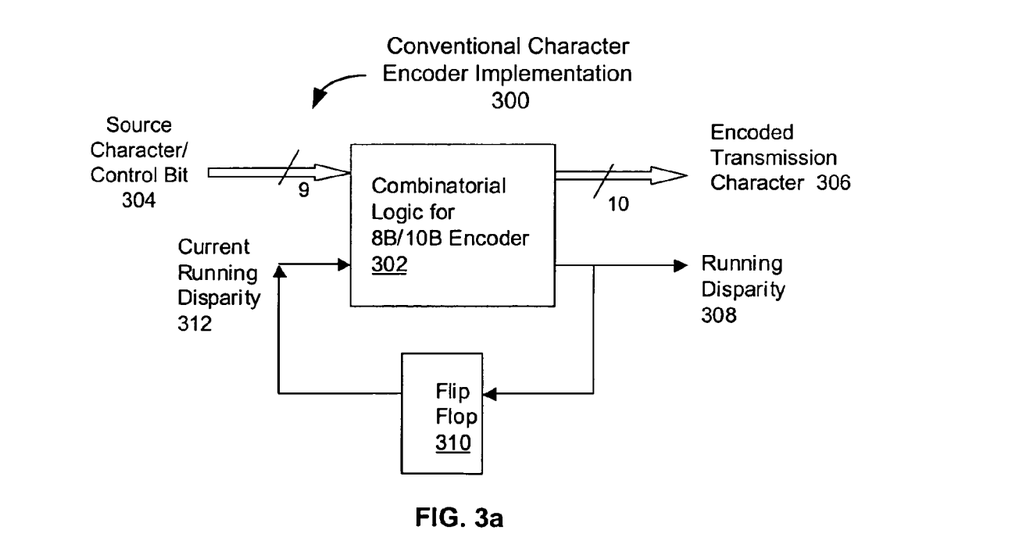
FIG. 3a is a block diagram illustrating a conventional character encoder implementation.

An alternative character encoder implementation 300 is shown in FIG. 3a. In this case, the same function shown in FIGS. 1 and 2 is performed in a single clock edge, instead of using a dual-phase clock. A large combinational logic block 302 is placed between the source character 304 and the output transmission character 306. The running disparity 308 is captured by flip-flop 310 once each character time, where it becomes the current running disparity 312 to be used in encoding the following character. The critical path in this implementation is the running disparity calculation of each character.

Figure 3B:
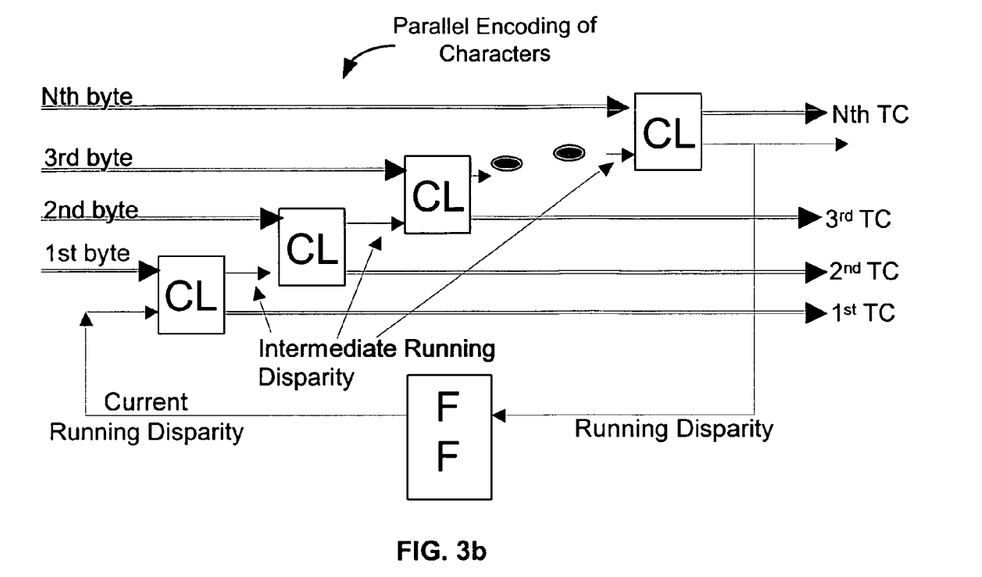
FIG. 3b is a block diagram illustrating an alternate character encoder implementation with parallel encoding.

Due to the finite speed of logic circuits, it is often necessary to encode multiple characters in parallel. FIG. 3b illustrates a character encoder implementation that encodes multiple characters in parallel. The total time gained is effectively the number of characters encoded in parallel minus one, multiplied by the setup and clock-to-out time of the running disparity-tracking flip-flop. However, the delays in this implementation remain dominated by the sequential gating structures used to calculate the running disparity of each character.

Figure 3C:
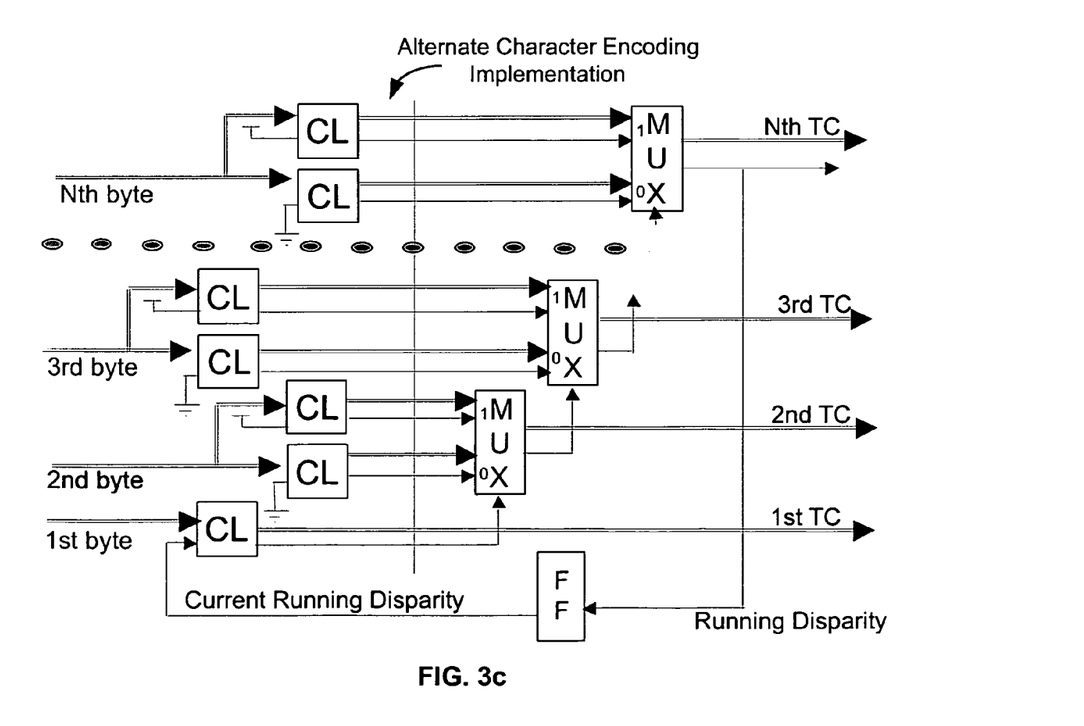
FIG. 3c is a block diagram illustrating an alternate character encoder implementation with reduced delays.

FIG. 3c illustrates a character encoder implementation that speeds up a portion of the disparity calculation function when implemented across multiple characters. This implementation is described in U.S. Patent Application No. 60/503,570, filed on Sep. 17, 2003, entitled "Faster 8B/10B Encoding and Decoding on Multi-Byte Datapath." In this implementation, one encoder for each character in the data path generates the new transmission character assuming the previous one ended with positive running disparity, and another encoder generates the new transmission character assuming the previous one ended with negative running disparity. A multiplexer is used to select one of each of the generated pairs of transmission characters. This allows the encode function to occur in parallel on multiple characters and reduces the critical path to the delay of the running disparity calculation of the first character plus the delay through successive multiplexers of the remaining characters in the data path. However, this implementation requires the number of encoders to be doubled, the number of running disparity calculation circuits to be doubled, and adds multiple 11-bit-wide 2:1 multiplexers.

BRIEF DESCRIPTION OF DRAWINGS

The invention may best be understood by referring to the following description and accompanying drawings that are used to illustrate embodiments of the invention. In the drawings.

DETAILED DESCRIPTION

Embodiments of a system and method for a feed-forward encoder are described. In the following description, numerous specific details are set forth. However, it is understood that embodiments of the invention may be practiced without these specific details. In other instances, well-known circuits, structures and techniques have not been shown in detail in order not to obscure the understanding of this description.

References throughout this description to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this description are not necessarily all referring to the same embodiment. Furthermore, the particular features, structures, or characteristics may be combined in any suitable manner in one or more embodiments.

Embodiments of the invention describe an 8B/10B encoder which enables calculation of the running disparity of characters before the characters are encoded. In the conventional 8B/10B encoder 100 shown in FIG. 1, the running disparity is calculated based on the presently encoded character and fed back to be used to encode the next character. In the encoder of the present invention, the running disparity calculation block 106 is taken out of the conventional 8B/10B encoder 100, and the running disparity calculation is performed separately from the encoding of the source characters. This enables the running disparity calculation to be performed prior to the encoding of the source characters.

Figure 4:
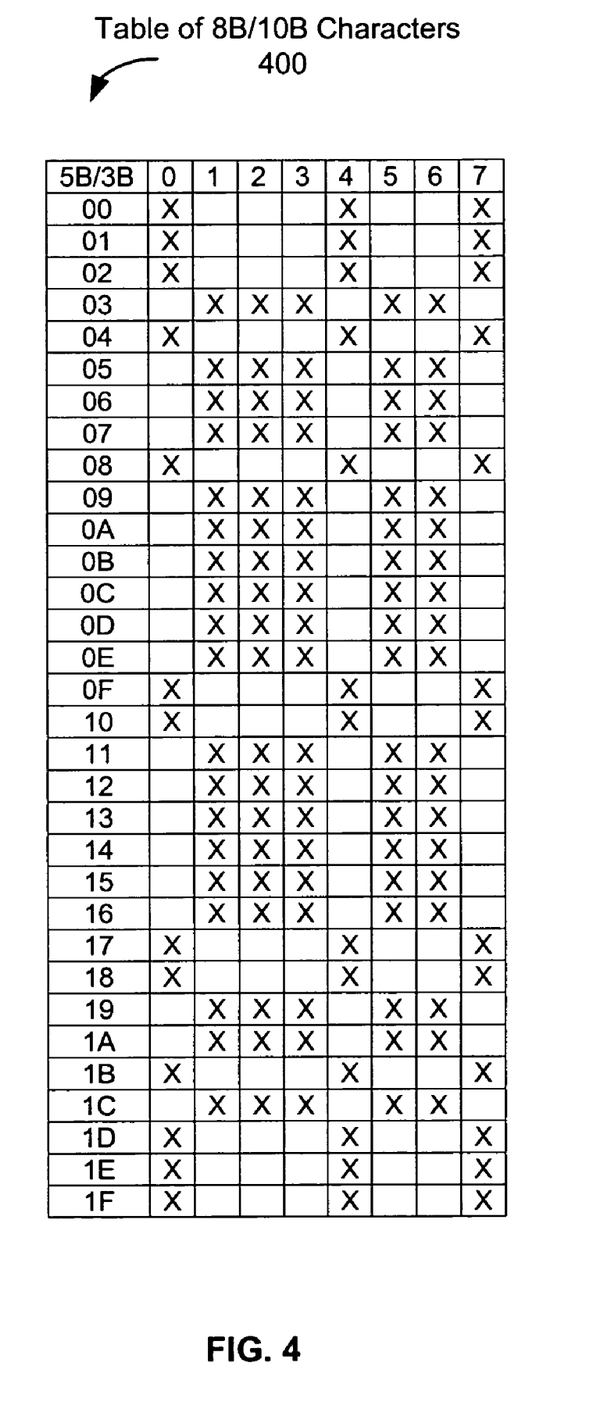
FIG. 4 is a table of 8B/10B data characters.

Referring to FIG. 4, a table 400 of 8B/10B data characters is shown. This table is organized according to 5B and 3B partitioning of the data characters within the encoder and whether the characters maintain or invert the running disparity. An X indicates that the associated data character maintains the same running disparity, while a blank indicates that the associated data character inverts the running disparity. By analyzing the possible data characters in this way, one or more patterns may be recognized. For example, there are two types of columns, and each is the inverse of the other. There are also two types of rows, and each is the inverse of the other. Using these recognized patterns and a current running disparity value, the running disparity of one or more characters may be predicted prior to the encoding of the one or more characters.

Figure 5:
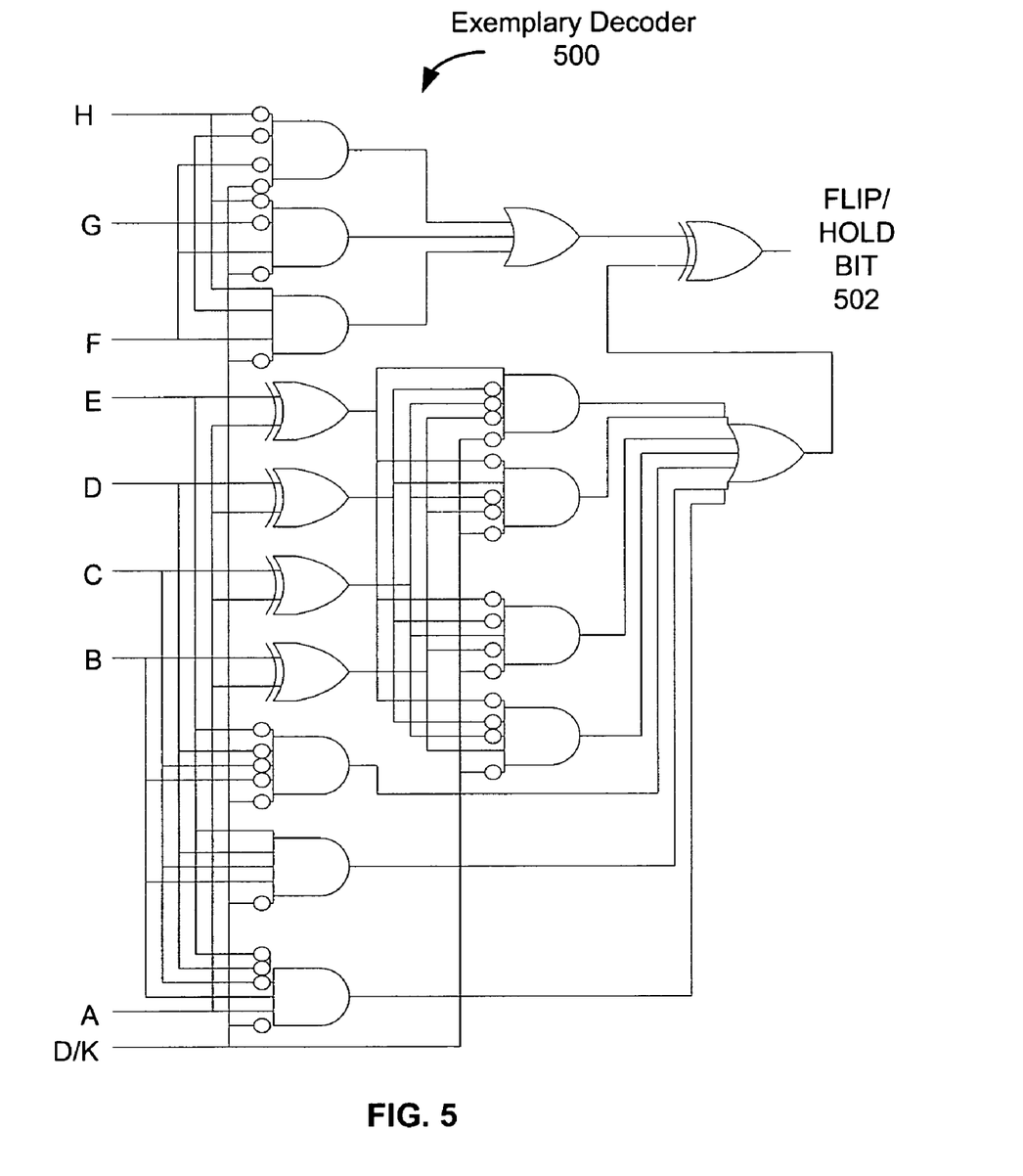
FIG. 5 is a diagram illustrating an exemplary decoder for the flip/hold function according to an embodiment of the invention.

Various circuits may be used to implement a decoder to determine whether a character will maintain (hold) or invert (flip) the running disparity. The logic for these decoders may be based on the table of FIG. 4 for data characters, and simplified using known methods, such as K-maps, Quine-McClusky, or Espresso. FIG. 5 illustrates one example of a decoder 500 for the flip/hold function according to an embodiment of the invention. This exemplary decoder covers all 256 possible data characters and takes as input a 9-bit character with eight data bits A to H and a data/control (D/K) selector bit. The A to H bits are each assigned specific binary weighting as defined in the IEEE 802.3 standard. The decoder 500 determines, based on the input data character, whether the character will maintain invert the current running disparity, relative to the previous character. If the character will maintain the current running disparity, the flip/hold bit 502 will be a logic value of 0. If the character will invert the current running disparity, the flip/hold bit 502 will be a logic value of 1. One or more circuit elements to handle the twelve control characters will also be implemented. The one or more circuit elements may be as simple as a single gate added to the decoder 500 of FIG. 5, depending on the control characters. The flip/hold bit 502 may be calculated at various locations in the data path, such as where the character is first generated or received, or just before the character is sent to an 8B/10B encoder. If the flip/hold bit is generated early in the data path, it can provide for error detection, since it contains redundant information based on the specific bit combinations present in each data character, similar to a parity bit.

Once the flip/hold bit is determined, the running disparity of each character may be determined by comparing the flip/hold bit with the current running disparity. In one embodiment, the current running disparity is Exclusive ORed (XORed) with the flip/hold bit. As a starting point, the current running disparity may be set to a specific value. For instance, certain protocols specify that running disparity should be initialized to a specific value. In this case, the current running disparity may be set to this value as a starting point to meet the requirements of the protocol. For example, in Fibre Channel, the standard specifies that following a reset, the running disparity should be initialized to negative. Therefore, for Fibre Channel, the current running disparity may be set to negative as a starting point to meet the requirements of the protocol. Alternatively, no specific value of running disparity may be set in the beginning. In this case, the current running disparity may start out as being positive or negative, since no specific value is needed. In one embodiment, additional gates may be added to force specific running disparity using override characters.

Figure 6:
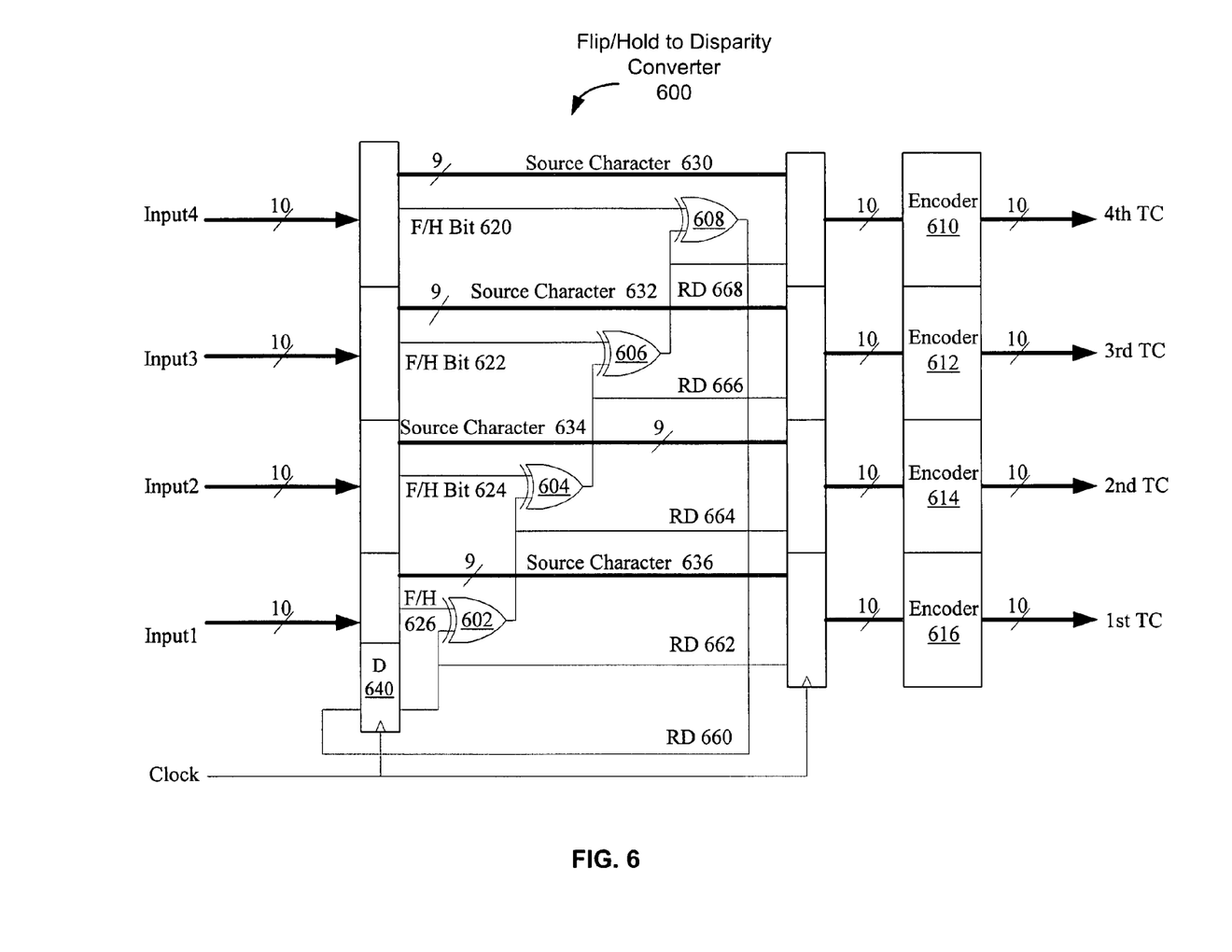
FIG. 6 is a diagram illustrating a flip/hold to running disparity converter according to an embodiment of the invention.

FIG. 6 is a diagram illustrating a flip/hold to running disparity converter 600 according to an embodiment of the invention. The flip/hold bits, such as 620–626, are generated at some point in the data path using a decoder, such as the decoder 500 shown in FIG. 5, and are accepted as inputs along with the associated source characters, such as 630–636. These decoders may exist outside of the running disparity converter circuit 600, and the associated flip/hold bits are carried through the data path as part of the associated characters. Each flip/hold bit is compared using an XOR gate, such as 602–608, to a current running disparity, such as 662–668, to determine the running disparity for that character, and thus the current running disparity for the following character. The current running disparity for each character is then passed along with the character, such as 630–636, to an encoder, such as 610–616, to encode each character to a transmission character (TC). The output of the XOR gate 608, which is the running disparity 660 from the last character, is captured in a flip-flop 640 and becomes the current running disparity 662 on the following clock cycle.

In the circuit of FIG. 6, there is only a single feedback term that is based on a single XOR gate delay per character. Also, the encoders 610–616 do not have to contain any gates to calculate the running disparity of each character, since the running disparity of each data character is known before the character is encoded. Therefore, the running disparity calculation logic may be removed from the conventional 8B/10B encoder 100 shown in FIG. 1, which simplifies the encoder logic significantly.

Figure 7:
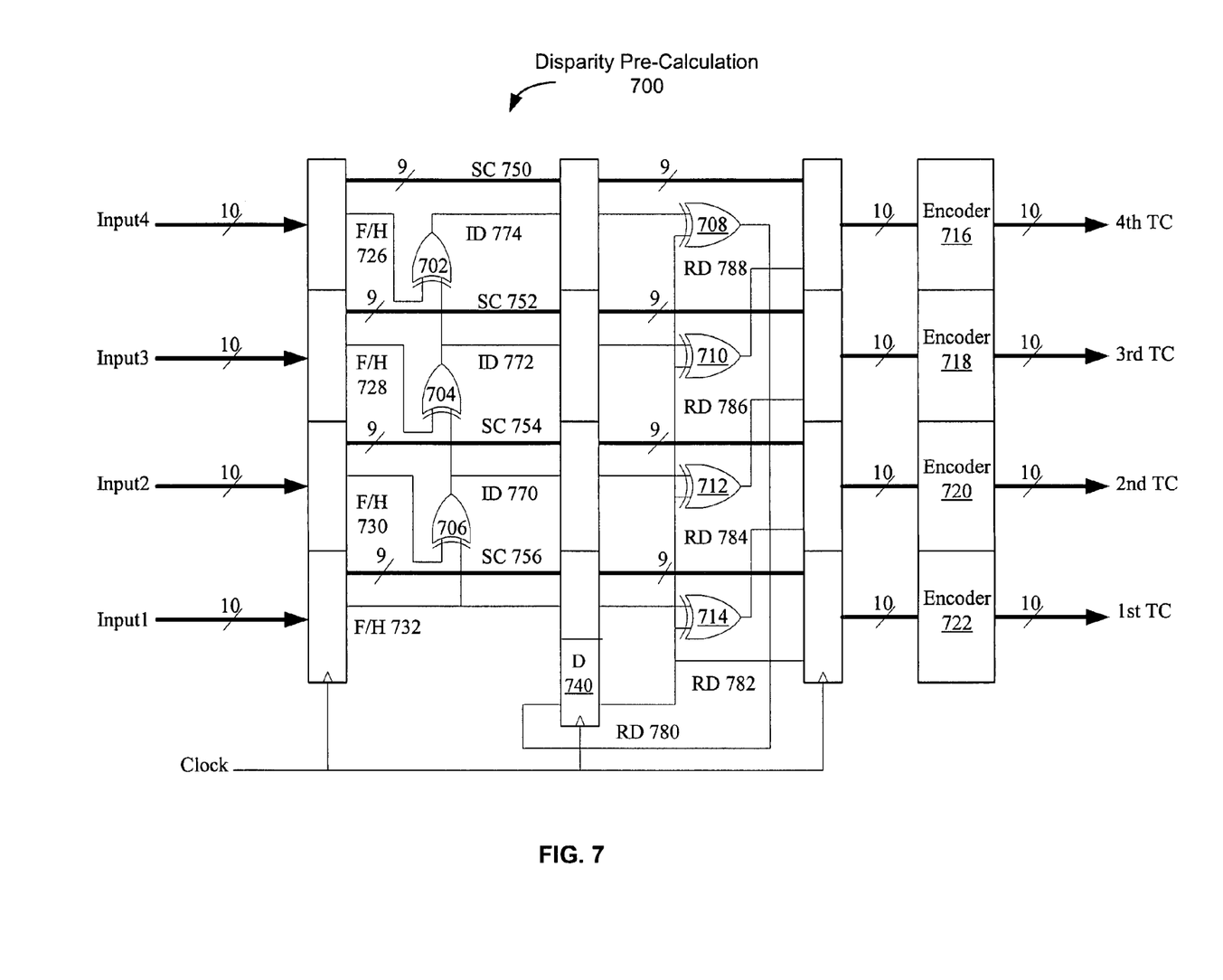
FIG. 7 is a diagram illustrating a running disparity precalculator according to an embodiment of the invention.

FIG. 7 illustrates a running disparity calculator 700 with partial pre-calculation according to an embodiment of the invention. The running disparity calculator 700 performs the same function as the circuit 600 shown in FIG. 6. However, the circuit 600 includes a cascade delay of a number of sequential XOR gates (four such gates are shown in FIG. 6). The running disparity calculator 700 reduces this delay path to a single 2:1 XOR gate (for example, gates 708–714 in FIG. 7) by recognizing that the XOR operations are fully commutative, or order independent. Therefore, most of the logic in the feedback term may be pre-calculated one or more clock cycles in advance, as shown in FIG. 7, using XOR gates such as 702–706 to determine an intermediate running disparity (ID), such as 770–774, based on the flip/hold bits 726–732. Each intermediate running disparity is then compared using an XOR gate, such as 708–714, to a current running disparity 782 to determine the running disparity of each character. The current running disparity 782 and the running disparities 784–788 are then passed along with the associated source characters 750–756 to encoders 716–722 to encode the characters to transmission characters. The output of the XOR gate 708, which is the running disparity 780 from the last character, is captured in a flip-flop 740 and becomes the current running disparity 782 on the following clock cycle.

The circuit 700 of FIG. 7 reduces the delay of the actual running disparity calculation to a single XOR gate, regardless of the number of characters operated on in each clock cycle. Furthermore, the pre-calculation may be performed across multiple pipeline stages to reduce the delay even further. The pre-calculation of terms, performed for example by XOR gates 702–706, may be performed at numerous locations in the system and is not limited to the last pipeline register before the actual running disparity calculation is performed by gates 708–714.

Figure 8:
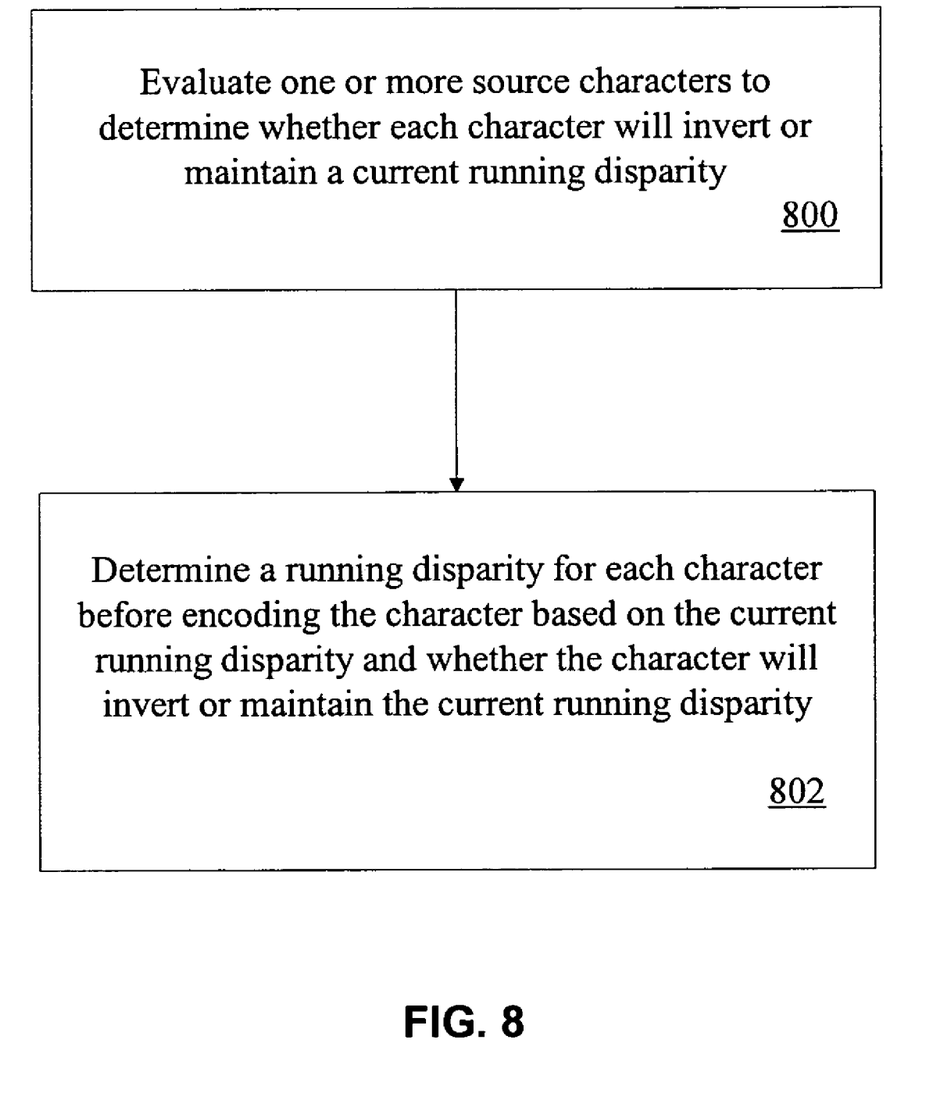
FIG. 8 is a flow diagram illustrating a method according to an embodiment of the invention.

FIG. 8 illustrates a method according to one embodiment of the invention. At 800, one or more source characters are evaluated to determine whether each character will invert or maintain a current running disparity. The source character may be a data character or a control character. In one embodiment, each character is evaluated to determine a flip/hold bit based on whether each character will invert or maintain a current running disparity. In one embodiment, the characters are evaluated using a lookup table to determine whether each character will invert or maintain a current running disparity. In one embodiment, the characters are evaluated using one or more logic gates to determine whether each character will invert or maintain a current running disparity.

At 802, a running disparity for each source character is determined before encoding the character based on the current running disparity and whether the character will invert or maintain the current running disparity. In one embodiment, the flip/hold bit of each character is compared with the current running disparity to determine a running disparity. In one embodiment, the flip/hold bit is compared with the current running disparity using an XOR gate. In one embodiment, the running disparity of each character is passed to an encoder to encode the following source character into a transmission character.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    evaluating one or more source characters to determine an intermediate running disparity for each of the one or more source characters; and
    determining a running disparity for each of the one or more source characters before encoding the one or more source characters based on a current running disparity associated with the one or more source characters and the intermediate running disparity of each of the one or more source characters.

2. The method of claim 1, wherein evaluating the one or more source characters comprises evaluating each of the one or more source characters to determine a flip/hold bit based on whether a respective source character will invert or maintain the current running disparity.

3. The method of claim 2, wherein determining the running disparity for each of the one or more source characters comprises comparing the flip/hold bit of the respective source character with the current running disparity.

4. The method of claim 3, wherein determining the running disparity for each character comprises using an exclusive or (XOR) function to compare the flip/hold bit with the current running disparity.

5. The method of claim 1, wherein evaluating the one or more source characters comprises using one or more logic gates to determine whether each of the one or more source characters will invert or maintain the current running disparity.

6. The method of claim 1, further comprising passing the current running disparity, the running disparity of each of the one or more source characters, and the one or more source characters to an encoder to encode the one or more source characters into one or more transmission characters.

7. The method of claim 1, wherein evaluating the one or more source characters comprises using a lookup table to determine whether each of the one or more source characters will invert or maintain the current running disparity.

8. A circuit comprising:
    a decoder to determine a flip/hold bit for each of a plurality of source characters based on whether a respective source character will invert or maintain a current running disparity associated with the plurality of source characters;
    a pre-calculator to determine an intermediate running disparity for each of the plurality of source characters; and
    a comparator coupled to the decoder and the pre-calculator to compare the intermediate running disparity of each of the plurality of source characters with the current running disparity to determine a running disparity for the respective source character before the respective source character is encoded.

9. The circuit of claim 8, wherein the comparator comprises one or more exclusive or (XOR) gates.

10. The circuit of claim 8, wherein the pre-calculator comprises one or more exclusive or (XOR) gates.

11. The circuit of claim 8, further comprising an encoder coupled to the comparator to receive the current running disparity, a plurality of running disparities of the plurality of source characters, and the plurality of source characters and to encode the plurality of source characters to a plurality of transmission characters.

12. The circuit of claim 11, wherein the encoder is an 8B/10B encoder that does not contain disparity calculation circuitry.

13. An apparatus comprising:
    means for evaluating one or more source characters to determine an intermediate running disparity for each of the one or more source characters; and
    means for determining a running disparity for each of the one or more source characters based on a current running disparity associated with the one or more source characters and the intermediate running disparity of each of the one or more source characters before the source character is encoded.

14. The apparatus of claim 13, wherein the means for determining the running disparity for each of the one or more source characters comprises means for comparing a flip/hold bit with the current running disparity.

15. The apparatus of claim 13, wherein the means for determining the running disparity for each of the one or more source characters comprises means for pre-calculating at least a portion of the running disparity.

16. The apparatus of claim 13, wherein the means for evaluating the one or more source characters comprises one or more logic gates to determine whether each source character will invert or maintain the current running disparity.

17. The apparatus of claim 13, further comprising an encoder coupled to the means for determining the running disparity for each of the one or more source characters to receive the current running disparity, the running disparity for each of the one or more source characters, and the one or more source characters and to encode the one or more source characters to one or more transmission characters.

18. The apparatus of claim 17, wherein the encoder is an 8B/10B encoder that does not contain disparity calculation circuitry.

* * * * *